United States Patent
Nagai et al.

(10) Patent No.: US 11,246,214 B2
(45) Date of Patent: Feb. 8, 2022

(54) RESIN MULTILAYER BOARD

(71) Applicant: Murata Manufacturing Co., Ltd., Nagaokakyo (JP)

(72) Inventors: Tomohiro Nagai, Nagaokakyo (JP); Shigeru Tago, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/186,061

(22) Filed: Feb. 26, 2021

(65) Prior Publication Data

US 2021/0185807 A1    Jun. 17, 2021

Related U.S. Application Data

(63) Continuation of application No. PCT/JP2019/037926, filed on Sep. 26, 2019.

(30) Foreign Application Priority Data

Sep. 27, 2018   (JP) .............................. JP2018-181111

(51) Int. Cl.
*H05K 1/03* (2006.01)
*H05K 1/02* (2006.01)
(Continued)

(52) U.S. Cl.
CPC ........... *H05K 1/036* (2013.01); *H05K 1/0271* (2013.01); *H05K 1/0278* (2013.01); *H05K 1/147* (2013.01);
(Continued)

(58) Field of Classification Search
CPC .... H05K 1/036; H05K 1/0271; H05K 1/0278; H05K 1/147; H05K 1/16;
(Continued)

(56) References Cited

U.S. PATENT DOCUMENTS

2003/0219588 A1    11/2003   Ogawa et al.
2009/0025971 A1*    1/2009   Kanemaru ............. H05K 1/185
                                                   174/260
(Continued)

FOREIGN PATENT DOCUMENTS

JP    2001-036253 A    2/2001
JP    2003-298196 A    10/2003
(Continued)

OTHER PUBLICATIONS

Official Communication issued in International Patent Application No. PCT/JP2019/037926, dated Nov. 12, 2019.

*Primary Examiner* — Hoa C Nguyen
(74) *Attorney, Agent, or Firm* — Keating & Bennett, LLP

(57) ABSTRACT

A resin multilayer board includes an insulating substrate including a first main surface and mounting electrodes only on the first main surface. The insulating substrate includes first and second resin layers that are laminated. The Young's modulus of the second resin layers is higher than that of the first resin layers. The first and second resin layers are arranged in a distributed manner along a lamination direction of the first and second resin layers. The insulating substrate includes a first and second portions that are two equally divided portions of the insulating substrate in the lamination direction and are respectively positioned closer to the first main surface and farther from the first main surface, and a volume ratio of the second resin layers in the first portion is higher than a volume ratio of the second resin layers in the second portion.

20 Claims, 8 Drawing Sheets

(51) Int. Cl.
*H05K 1/14* (2006.01)
*H05K 1/16* (2006.01)
*H01Q 9/04* (2006.01)

(52) U.S. Cl.
CPC ............. *H05K 1/16* (2013.01); *H01Q 9/0407* (2013.01); *H05K 2201/015* (2013.01); *H05K 2201/0141* (2013.01); *H05K 2201/10098* (2013.01)

(58) Field of Classification Search
CPC ..... H05K 2201/0141; H05K 2201/015; H05K 2201/10098
See application file for complete search history.

(56) References Cited

U.S. PATENT DOCUMENTS

| | | | |
|---|---|---|---|
| 2010/0243299 A1 | 9/2010 | Kariya et al. | |
| 2011/0073358 A1* | 3/2011 | Hayashi | H05K 3/4655 174/258 |
| 2013/0043067 A1* | 2/2013 | Hayashi | H05K 1/0373 174/258 |
| 2013/0180765 A1* | 7/2013 | Aoshima | B32B 17/061 174/255 |
| 2013/0192882 A1* | 8/2013 | Nejime | H05K 1/036 174/255 |
| 2015/0305136 A1 | 10/2015 | Tachikawa | |
| 2016/0091637 A1* | 3/2016 | Yasushita | G02B 1/14 349/96 |
| 2016/0212854 A1* | 7/2016 | Kuroda | H01L 21/4857 |
| 2017/0352628 A1* | 12/2017 | Furuichi | H01L 23/49827 |
| 2018/0014402 A1* | 1/2018 | Kashiwakura | H05K 3/064 |
| 2018/0368254 A1* | 12/2018 | Adachi | H05K 3/4644 |
| 2019/0090362 A1 | 3/2019 | Yosui | |
| 2019/0194537 A1* | 6/2019 | Sekiguchi | C08K 5/55 |
| 2019/0269010 A1 | 8/2019 | Araki et al. | |

FOREIGN PATENT DOCUMENTS

| | | |
|---|---|---|
| JP | 2010-232636 A | 10/2010 |
| JP | 2015-056555 A | 3/2015 |
| JP | 2016-164882 A | 9/2016 |
| WO | 2014/069389 A1 | 5/2014 |
| WO | 2018/100922 A1 | 6/2018 |
| WO | 2018/123459 A1 | 7/2018 |

\* cited by examiner

RESIN MULTILAYER BOARD

CROSS REFERENCE TO RELATED APPLICATIONS

This application claims the benefit of priority to Japanese Patent Application No. 2018-181111 filed on Sep. 27, 2018 and is a Continuation Application of PCT Application No. PCT/JP2019/037926 filed on Sep. 26, 2019. The entire contents of each application are hereby incorporated herein by reference.

BACKGROUND OF THE INVENTION

1. Field of the Invention

The present invention relates to a resin multilayer board, and more particularly, to a resin multilayer board including a plurality of different resin substrates.

2. Description of the Related Art

Conventionally, a resin multilayer board has been known that includes an insulating substrate formed by laminating a plurality of resin layers having different elastic moduli, and a conductor pattern formed on the resin substrate.

For example, WO2018/100922 discloses a resin multilayer board having a structure formed by laminating a first resin layer and a second resin layer, in which the first resin layer with a relatively high elastic modulus is provided on a mounting surface side and recesses and protrusions are provided on bonded surfaces (interface) between the first resin layer and the second resin layer. With this configuration, the bonding strength between the first resin layer and the second resin layer can be increased, such that the bonded surfaces between the first resin layer and the second resin layer are less likely to be peeled due to a difference in a coefficient of linear expansion or external force. Furthermore, with this configuration, the mechanical strength of the mounting surface on which the first resin layer having a high elastic modulus is arranged is increased, and the flatness of the mounting surface can be increased. Thus, a higher mountability to another circuit board is achieved.

However, with the resin multilayer board described in WO2018/100922, when the conductor pattern is formed on the front surface of a resin substrate having recesses and protrusions, it is difficult to control a circuit formed on the resin multilayer board to have predetermined electrical characteristics due to deformation of the conductor pattern.

SUMMARY OF THE INVENTION

Preferred embodiments of the present invention provide resin multilayer boards each including a plurality of resin substrates with different elastic moduli, in which predetermined electrical characteristics as well as a higher mechanical strength of a mounting surface are achieved, while reducing the risk of peeling of bonded surfaces of the resin substrates due to a change in a coefficient of linear expansion and external force.

A resin multilayer board according to a preferred embodiment of the present invention includes an insulating substrate including a plurality of first resin layers and a plurality of second resin layers that are laminated, the insulating substrate including a first main surface; conductor patterns provided on the insulating substrate; and a mounting electrode provided only on the first main surface, in which a Young's modulus of the second resin layers is higher than a Young's modulus of the first resin layers, the plurality of first resin layers and the plurality of second resin layers are arranged in a distributed manner along a lamination direction of the plurality of first resin layers and the plurality of second resin layers, the insulating substrate includes a first portion and a second portion that are two equally divided portions of the insulating substrate in the lamination direction and are respectively positioned closer to the first main surface and farther from the first main surface, and a volume ratio of the second resin layers in the first portion is higher than a volume ratio of the second resin layers in the second portion.

This configuration includes the plurality of first resin layers and the plurality of second resin layers arranged in a distributed manner and a plurality of bonded surfaces between the first resin layers and the second resin layers, such that stress produced due to a difference in the coefficient of linear expansion or the application of external force is distributed, instead of being concentrated on one of the bonded surfaces. Thus, delamination due to a difference in the coefficient of linear expansion between resin layers and the application of external force is able to be reduced or prevented compared with an insulating substrate including a single bonded surface between the first resin layer and the second resin layer.

Furthermore, with this configuration, the stress is distributed, instead of being concentrated on one bonded surface, such that the peeling of the bonded surfaces is able to be reduced or prevented without forming recesses and protrusions on the bonded surfaces. Thus, the electrical characteristics are less likely to fluctuate due to a deformation of the conductor patterns provided on the bonded surfaces. Thus, a circuit with a predetermined electrical characteristics can be easily provided on the resin multilayer board.

With this configuration, the Young's modulus on the side of the first main surface (mounting surface) of the insulating substrate is relatively increased, such that the deformation of the first main surface during the mounting or heat processing of the resin multilayer board is reduced or prevented. Thus, mounting failure of the resin multilayer board on another circuit board, or mounting failure of a mounted component on the resin multilayer board is able to be reduced or prevented.

Preferred embodiments of the present invention provide resin multilayer boards each including a plurality of resin substrates with different elastic moduli, in which predetermined electrical characteristics as well as a higher mechanical strength of a mounting surface are achieved, while reducing the risk of peeling of bonded surfaces of the resin substrates due to a change in a coefficient of linear expansion and external force.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
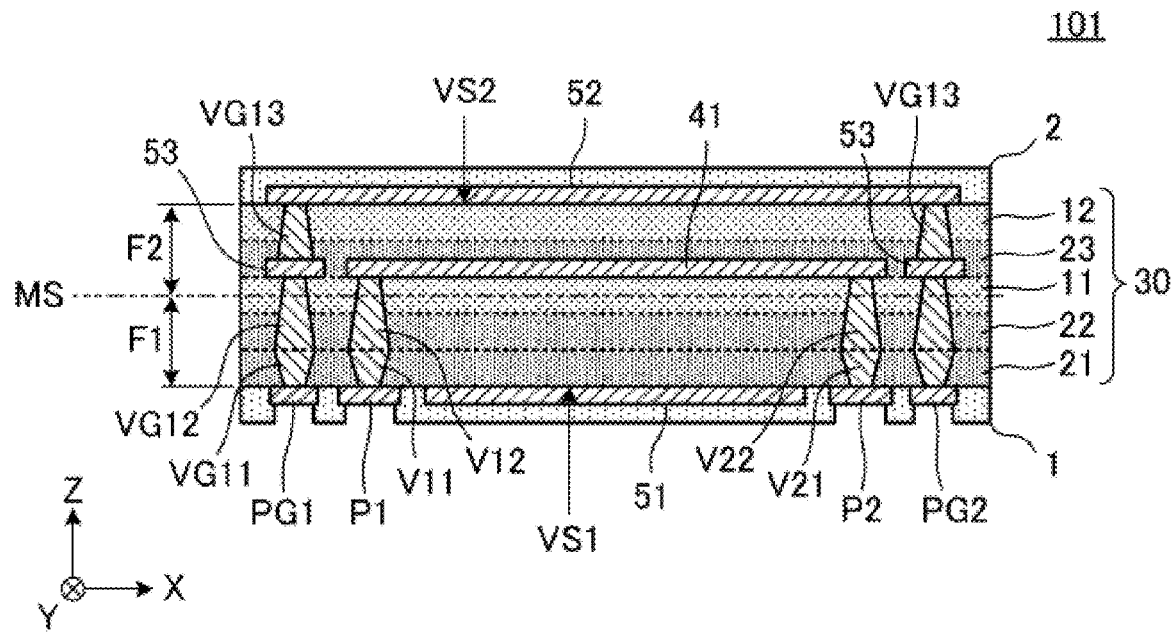
FIG. 1A is a sectional view of a resin multilayer board 101 according to a first preferred embodiment of the present invention.

Hereinafter, preferred embodiments of the present invention will be illustrated with reference to the drawings and some specific examples. The same or corresponding portions and elements in each figure are denoted by the same reference numerals. Although the preferred embodiments are illustrated separately for convenience in consideration of explanation of the main points or ease of understanding, partial replacement or combination of the configurations illustrated in different preferred embodiments is possible. In second and subsequent preferred embodiments, the description of matters common to a first preferred embodiment will be omitted, and only the differences will be described. In particular, the same advantageous operations and effects due to the same configuration will not be described for each preferred embodiment.

First Preferred Embodiment

Figure 1B:
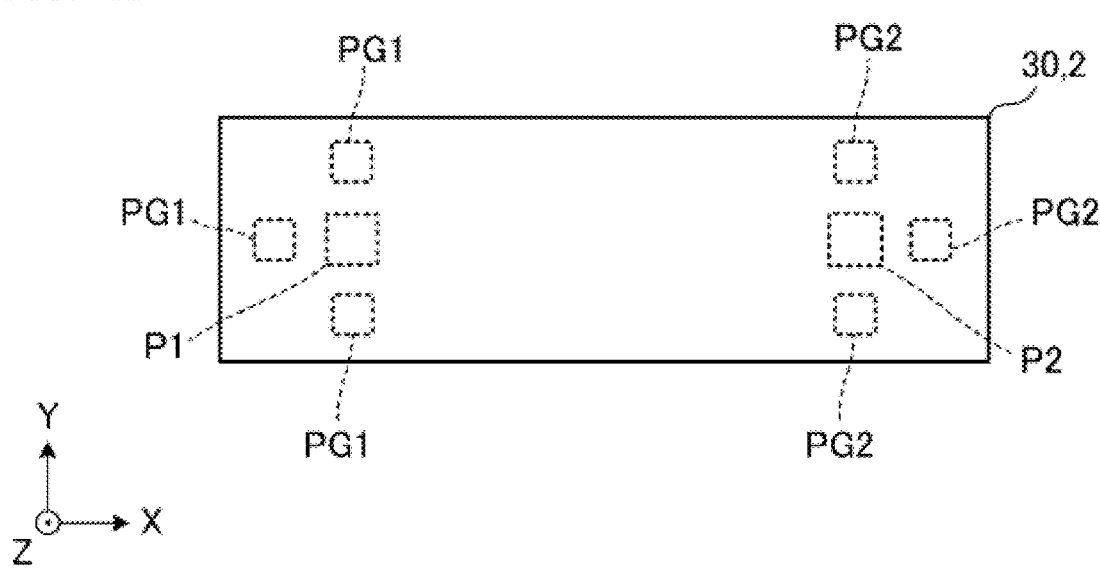
FIG. 1B is a plan view of the resin multilayer board 101.
Figure 2:
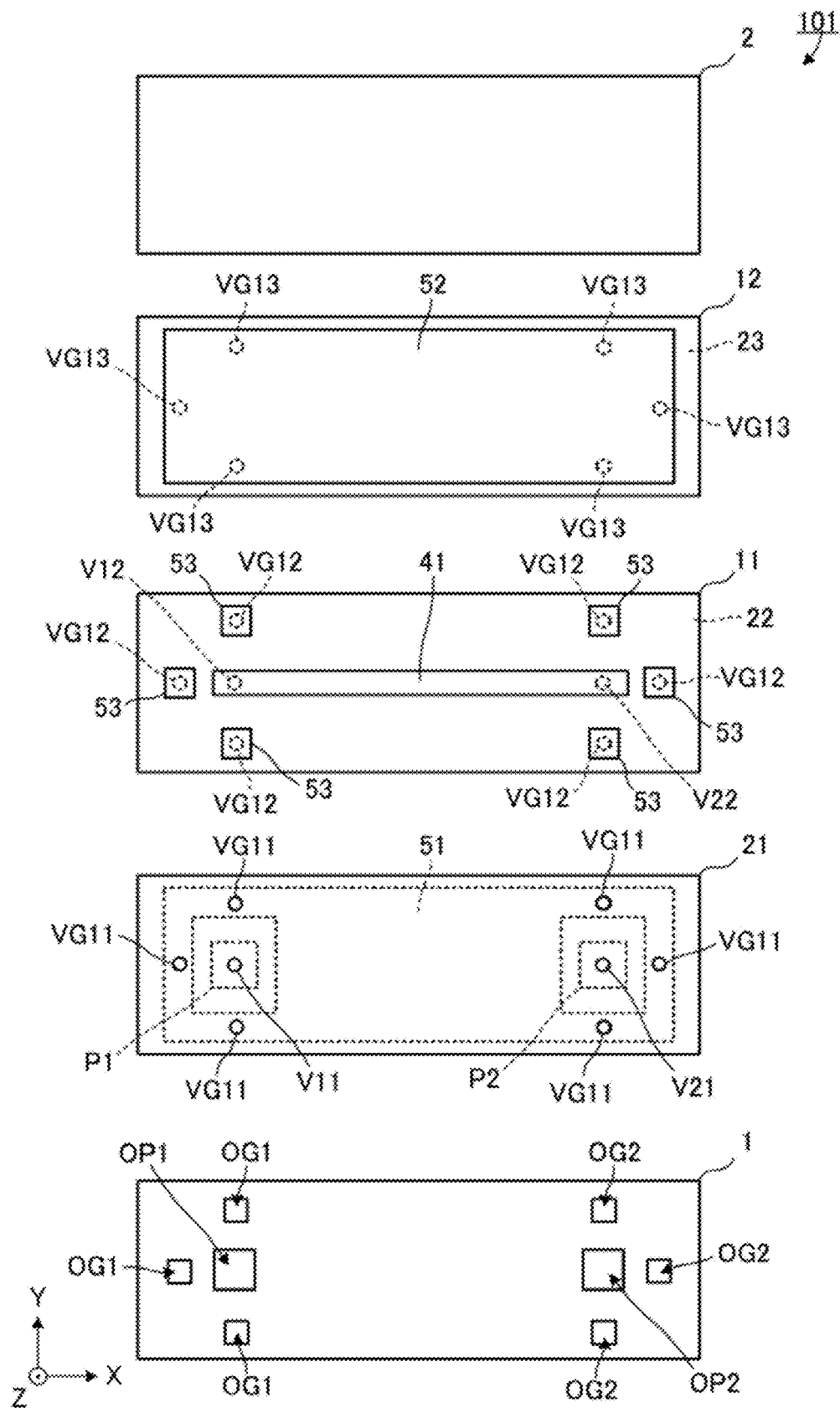
FIG. 2 is an exploded plan view of the resin multilayer board 101.

FIG. 1A is a sectional view of a resin multilayer board 101 according to a first preferred embodiment, and FIG. 1B is a plan view of the resin multilayer board 101. FIG. 2 is an exploded plan view of the resin multilayer board 101.

The resin multilayer board 101 includes an insulating substrate 30, conductor patterns (a signal conductor pattern 41, ground conductor patterns 51 and 52 and a plurality of connecting conductor patterns 53) provided on a front surface of or inside the insulating substrate 30, mounting electrodes P1 and P2, a plurality of interlayer connecting conductors V11, V12, V21, V22, VG11, VG12, and VG13, protective films 1 and 2, and the like.

The insulating substrate 30 is a rectangular or substantially rectangular flat plate having a longitudinal direction matching an X-axis direction, and includes a first main surface VS1 and a second main surface VS2 opposite to each other. The insulating substrate 30 is a base body including a thermoplastic resin as a main component.

As illustrated in FIG. 1A, the mounting electrodes P1 and P2, the ground conductor pattern 51, and the protective film 1 are provided on the first main surface VS1 of the insulating substrate 30. The signal conductor pattern 41, the plurality of connecting conductor patterns 53, and the plurality of interlayer connecting conductors V11, V12, V21, V22, VG11, VG12, and VG13 are provided inside the insulating substrate 30. The ground conductor pattern 52 and the protective film 2 are provided on the second main surface VS2 of the insulating substrate 30.

The insulating substrate 30 is a laminated body including a plurality of first resin layers 11 and 12 and a plurality of second resin layers 21, 22, and 23 that are laminated. Specifically, the insulating substrate 30 includes the second resin layers 21 and 22, the first resin layer 11, the second resin layer 23, and the first resin layer 12 that are laminated in this order. The first resin layers 11 and 12 and the second resin layers 21, 22, and 23 include resin (for example, thermoplastic resin) as a main component and have a rectangular or substantially rectangular flat flexible plate shape having longitudinal directions matching the X-axis direction. The first resin layers 11 and 12 have a Young's modulus (E1) higher than a Young's modulus (E2) of the second resin layers 21, 22, and 23 (E1>E2). The first resin layers 11 and 12 are sheets preferably including, as a main component, a fluororesin such as perfluoroalkoxy alkane (PFA) and polytetrafluoroethylene (PTFE) for example. The second resin layers 21, 22, and 23 are resin sheets preferably including, for example, a liquid crystal polymer (LCP) as a main component.

In the present preferred embodiment, the plurality of first resin layers 11 and 12 and the plurality of second resin layers 21, 22, and 23 are arranged in a distributed manner in a lamination direction (Z-axis direction) of the first resin layers 11 and 12 and the second resin layers 21, 22, and 23. Note that "a plurality of first resin layers and a plurality of second resin layers are arranged while being distributed" indicates a state where the first resin layer is sandwiched between the second resin layers in the lamination direction, and the second resin layer is sandwiched between the first resin layers in the lamination direction.

The mounting electrodes P1 and P2 and the ground conductor pattern 51 are provided on the back surface of the second resin layer 21. The mounting electrode P1 is a rectangular or substantially rectangular conductor pattern arranged near a first end of the second resin layer 21 (the left end of the second resin layer 21 in FIG. 2). The mounting electrode P2 is a rectangular or substantially rectangular conductor pattern arranged near a second end of the second resin layer 21 (the right end of the second resin layer 21 in FIG. 2). The ground conductor pattern 51 is a planar conductor pattern provided on the entire or substantially the entire surface of the second resin layer 21. The mounting electrodes P1 and P2 and the ground conductor pattern 51 are preferably conductor patterns, such as Cu foil for example.

The signal conductor pattern 41 and the plurality of connecting conductor patterns 53 are provided on the front surface of the first resin layer 11. The signal conductor pattern 41 is a linear conductor pattern extending in a transmission direction (X-axis direction). The plurality of connecting conductor patterns 53 are rectangular or substantially rectangular conductor patterns respectively arranged near the first end (the left end of the first resin layer 11 in FIG. 2) and the second end (the right end of the first resin layer 11 in FIG. 2) of the first resin layer 11. The signal conductor pattern 41 and the connecting conductor pattern 53 are preferably conductor patterns, such as Cu foil for example.

The ground conductor pattern 52 is provided on the front surface of the first resin layer 12. The ground conductor pattern 52 is a planar conductor pattern provided on the entire or substantially the entire surface of the first resin layer 12. The ground conductor pattern 52 is preferably a conductor pattern, such as Cu foil for example.

The protective film 1 is laminated on the back surface of the second resin layer 21 (the first main surface VS1 of the insulating substrate 30), and has the same or substantially the same planar shape as the second resin layer 21. The protective film 2 is laminated on the front surface of the first resin layer (the second main surface VS2 of the insulating substrate 30), and has the same or substantially the same planar shape as the first resin layer 12. The protective films 1 and 2 are preferably, for example, a cover lay film, a solder resist film, an epoxy resin film, or the like.

The protective film 1 includes a plurality of openings OP1, OP2, OG1, and OG2. The opening OP1 is provided at a position corresponding to the position of the mounting electrode P1, and the opening OP2 is provided at a position corresponding to the position of the mounting electrode P2. Therefore, even when the protective film 1 is provided on the back surface of the second resin layer 21, the mounting electrode P1 is exposed to the outside through the opening OP1, and the mounting electrode P2 is exposed to the outside through the opening OP2. Further, the plurality of openings OG1 are provided near the first end of the protective film 1 (the left end of the protective film 1 in FIG. 2), and the plurality of openings OG2 are provided near the second end of the protective film 1 (the right end of the protective film 1 in FIG. 2). Therefore, even when the protective film 1 is provided on the back surface of the second resin layer 21, portions of the ground conductor pattern 51 are exposed to the outside through the plurality of openings OG1 and OG2. In the present preferred embodiment, the portions of the ground conductor pattern 51 exposed from the plurality of openings OG1 and OG2 define and function as ground electrodes PG1 and PG2.

As illustrated in FIG. 1A, the mounting electrode P1 is connected to one end of the signal conductor pattern 41 with the interlayer connecting conductors V11 and V12 interposed therebetween. The other end of the signal conductor pattern 41 is connected to the mounting electrode P2 with the interlayer connecting conductors V21 and V22 interposed therebetween. Thus, the mounting electrodes P1 and P2 are electrically connected to each other. As illustrated in FIG. 2 and the like, the ground conductor pattern 51 (ground electrodes PG1 and PG2) is connected to the ground conductor pattern 52 with the connecting conductor pattern 53 and the interlayer connecting conductors VG11, VG12, and VG13 interposed therebetween.

In the present preferred embodiment, a transmission line of a strip line structure is defined by the first resin layer 11 and the second resin layers 21 and 22 sandwiched between the signal conductor pattern 41, the ground conductor patterns 51 and 52, and the signal conductor pattern 41 and the ground conductor pattern 51; and the first resin layer 12 and the second resin layer 23 sandwiched between the signal conductor pattern 41 and the ground conductor pattern 52.

As illustrated in FIG. 1A, the insulating substrate 30 includes a first portion F1 and a second portion F2. Specifically, the first portion F1 is one of portions of the insulating substrate equally divided in two in the lamination direction (Z-axis direction) (divided at a dividing plane MS in FIG. 1A) positioned closer to the first main surface VS1. The second portion F2 is one of the portions of the insulating substrate 30 equally divided in two in the lamination direction, farther from the first main surface VS1. The volume ratio of the second resin layer in the first portion F1 is higher than the volume ratio of the second resin layer in the second portion F2. The volume ratio of the second resin layer in the first portion F1 is higher than the volume ratio of the first resin layer in the first portion F1. Here, the "volume ratio of the second resin layer in the first portion" refers to the ratio of the volume of the second resin layer to the volume of the first portion F1 and "the volume ratio of the second resin layer in the second portion" refers to the ratio of the volume of the second resin layer to the volume of the second portion F2. In FIG. 1A, the resin layer closest to the side where the mounting electrode is located is the second resin layer 21, but the resin layer closest to the side where the mounting electrode is located may be the first resin layer as long as the above volume ratio is obtained.

The second resin layer 21 of the present preferred embodiment includes the first main surface VS1 (mounting surface), and, thus, preferably has a relatively high Young's modulus. The coefficient of linear expansion of the second resin layer 21 including the first main surface VS1 preferably matches that of a circuit board as a mounting target or of a mounted component mounted on the resin multilayer board. Examples of such a material (material of the second resin layer) include a liquid crystal polymer (LCP) and an epoxy resin (EP). On the other hand, the first resin layers 11 and 12 are not resin layers directly including the first main surface VS1 (mounting surface), and thus are not significantly restricted by such a restriction. Thus, a material with a property suitable for the purpose may be selected for the first resin layers 11 and 12. When the resin multilayer board is used for high frequency applications as in the present preferred embodiment, the first resin layers 11 and 12 preferably include materials having excellent high frequency characteristics. Examples of such a material (material of the first resin layer) include perfluoroalkoxy alkane (PFA) and polytetrafluoroethylene (PTFE).

In the present preferred embodiment, the first resin layers 11 and 12 have better high frequency characteristics than the second resin layers 21, 22, and 23. Specifically, a relative permittivity (E1) of the first resin layers 11 and 12 is lower than a relative permittivity (E2) of the second resin layers 21, 22, and 23 (E1<E2). Further, the dielectric loss tangent of the first resin layers 11 and 12 is smaller than the dielectric loss tangent of the second resin layers 21, 22 and 23.

In the present preferred embodiment, as illustrated in FIGS. 1A and 2, the interlayer connecting conductors VG12 and VG13 are connected to each other with the connecting conductor pattern 53 interposed therebetween. The interlayer connecting conductor VG12 is a conductor including a portion provided on the first resin layer 11, and the interlayer connecting conductor VG13 is a conductor including a portion provided on the second resin layer 23. The connecting conductor pattern 53 is a conductor pattern that is arranged at the interface between the first resin layer 11 and the second resin layer 23 that are adjacent to each other, and is sandwiched between the interlayer connecting conductor VG12 and the interlayer connecting conductor VG13. The interlayer connecting conductor VG12 is an example of the "first interlayer connecting conductor", and the interlayer connecting conductor VG13 is an example of the "second interlayer connecting conductor".

The connecting conductor pattern 53 has an area (AC) that is larger than an area (A1) of the interlayer connecting conductor VG12 as viewed in the lamination direction (Z-axis direction), and is larger than an area (A2) of the interlayer connecting conductor VG13 as viewed in the Z-axis direction. (AC>A1, AC>A2).

Figure 3:
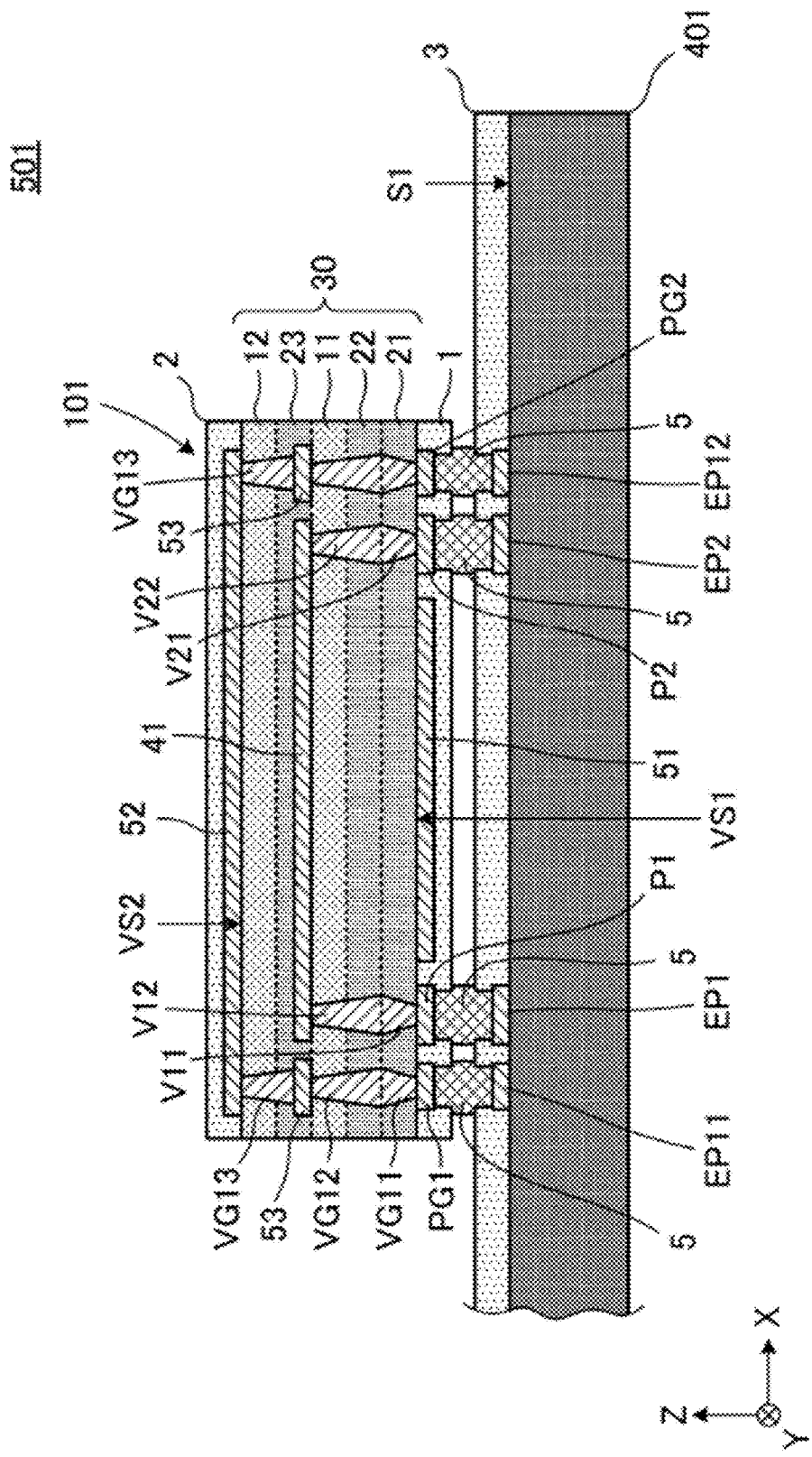
FIG. 3 is a sectional view illustrating a main portion of an electronic device 501 according to a first preferred embodiment of the present invention.

Next, a mounting example of the resin multilayer board 101 will be described with reference to FIG. 3. FIG. 3 is a sectional view illustrating a main portion of an electronic device 501 according to the first preferred embodiment.

The resin multilayer board 101 according to the present preferred embodiment is a surface mounted component.

The electronic device 501 includes the resin multilayer board 101, a circuit board 401, and the like. As illustrated in FIG. 3, external electrodes EP1, EP2, EP11, and EP12 and a protective film 3 are provided on a first surface S1 of the circuit board 401. The circuit board 401 is preferably, for example, a glass/epoxy board.

The resin multilayer board 101 is mounted on the first surface S1 of the circuit board 401.

Specifically, the mounting electrode P1 of the resin multilayer board 101 is connected to the external electrode EP1 of the circuit board 401 with a conductive bonding material 5, such as solder, for example, interposed therebetween. The mounting electrode P2 of the resin multilayer board 101 is connected to the external electrode EP2 of the circuit board 401 with the conductive bonding material 5 interposed therebetween. The ground electrode PG1 of the resin multilayer board 101 is connected to the external electrode EP11 of the circuit board 401 with the conductive bonding material 5 interposed therebetween. The ground electrode PG2 of the resin multilayer board 101 is connected to the external electrode EP12 of the circuit board 401 with the conductive bonding material 5 interposed therebetween. Although not illustrated, other chip components and the like are also mounted on the first surface S1 of the circuit board 401.

The resin multilayer board 101 according to the present preferred embodiment provides the following advantageous effects.

The insulating substrate 30 according to the present preferred embodiment is a laminated body in which the plurality of first resin layers 11 and 12 and second resin layers 21, 22, and 23 are arranged in a distributed manner. This configuration includes a plurality of bonded surfaces between the first resin layers and the second resin layers, such that stress produced due to a difference in the coefficient of linear expansion between the first resin layer and the second resin layer or the application of external force is distributed, instead of being concentrated on one of the bonded surfaces. Thus, delamination due to a difference in the coefficient of linear expansion between resin layers and the application of external force can be reduced or prevented compared with an insulating substrate including a single bonded surface between the first resin layer and the second resin layer.

Furthermore, with the configuration described above, the stress is distributed, instead of being concentrated on one bonded surface, such that the peeling of the bonded surfaces can be reduced or prevented without forming recesses and protrusions on the bonded surfaces. Thus, the electrical characteristics are less likely to fluctuate due to a deformation of the conductor patterns provided on the bonded surfaces. Thus, a circuit with a predetermined electrical characteristics can be easily provided on the resin multilayer board.

Furthermore, in the present preferred embodiment, the volume ratio of the second resin layer in the first portion F1 (the portion located on the side of the first main surface VS1) is higher than the volume ratio of the second resin layer in the second portion F2. This configuration results in a relatively higher Young's modulus on the side of the first main surface VS1 (mounting surface) of the insulating substrate 30, such that deformation of the first main surface VS1 during mounting (such as a reflow process for example) or thermal processing (during heat pressing or during bending process using heat for example) of the resin multilayer board is reduced or prevented. Thus, mounting failure of the resin multilayer board 101 on another circuit board, or mounting failure of a mounted component on the resin multilayer board can be reduced or prevented.

In the present preferred embodiment, a relative permittivity ($\varepsilon 1$) of the first resin layers 11 and 12 is lower than a relative permittivity ($\varepsilon 2$) of the second resin layers 21, 22, and 23 ($\varepsilon 1 < \varepsilon 2$). With this configuration, as illustrated in FIG. 1A, the first resin layer 11 with excellent high frequency characteristics is arranged at a position to be in contact with the signal conductor pattern 41, such that the high frequency characteristics of the resin multilayer board can be improved. Furthermore, with this configuration, a conductor loss in a circuit provided on the resin multilayer board 101 can be reduced or the resin multilayer board 101 (insulating substrate 30) can be thinner than that in a case of an insulating substrate formed by laminating a plurality of second resin layers only. Specifically, the insulating substrate 30 includes the first resin layers 11 and 12 having a lower relative permittivity than that of the second resin layers 21, 22, and 23. Thus, when a circuit with a predetermined characteristics is provided on the resin multilayer board, the line width of a conductor pattern provided on the insulating substrate 30 can be made wide, such that the conductor loss of the circuit can be reduced. Further, when a circuit having predetermined characteristics is provided on the resin multilayer board, the resin layer can be made thinner without narrowing the line width of the conductor pattern, such that the insulating substrate 30 can be made thinner.

Furthermore, the insulating substrate 30 includes the first resin layers 11 and 12 having a smaller dielectric loss tangent than the second resin layers 21, 22, 23. With this configuration, the dielectric loss can be reduced from that in the case of an insulating substrate formed by laminating a plurality of second resin layers only.

The insulating substrate 30 according to the present preferred embodiment is a base body made of a thermoplastic resin. With this configuration, a resin multilayer board that can be easily plastically deformed and can have a desired shape maintained (retained) can be obtained.

In the present preferred embodiment, the interlayer connecting conductor VG12 (first interlayer connecting conductor) provided on the first resin layer 11 and the interlayer connecting conductor VG13 (second interlayer connecting conductor) provided on the second resin layer 23 are connected with each other with the connecting conductor pattern 53 interposed therebetween. The area (AC) of the connecting conductor pattern 53 sandwiched between the first interlayer connecting conductor and the second interlayer connecting conductor is larger than any of the areas (A1, A2) of the interlayer connecting conductors VG12 and VG13 as viewed in the lamination direction (Z-axis direction) (AC>A1, AC>A2). The bonded surfaces (interface) of different materials, such as the first resin layer and the second resin layer, are likely to be misaligned during lamination due to a difference in physical property (for example, a difference in the coefficient of linear expansion). Due to such misalignment, connection between the interlayer conductors provided on these respective different materials is likely to result in connection failure. On the other hand, with the above configuration, the first interlayer connecting conductor provided on the first resin layer 11 and the second interlayer connecting conductor provided on the second resin layer 23 are connected with each other with the connecting conductor pattern 53 having a large area provided in between, such that connection failure due to misalignment attributable to the difference in physical property is less likely to occur. In other words, when the first interlayer connecting conductor and the second interlayer connecting conductor are connected with the connecting conductor pattern 53 interposed therebetween, if the connecting conductor pattern 53 is designed to have a large area, a risk of the connection failure due to the misalignment can be reduced.

The bonded surfaces (interface) of the same materials, such as the second resin layer 21 and the second resin layer 22, are less likely to be misaligned. Thus, interlayer connecting conductors needs not be connected with each other with the connecting conductor pattern interposed therebetween, as in a connection portion between the interlayer connecting conductors VG11 and VG12, for example. In the present preferred embodiment, an example is described in which the first interlayer connecting conductor and the second interlayer connecting conductor used for the connection between the ground conductor patterns 51 and 52 are connected with the connecting conductor pattern interposed therebetween. However, this should not be construed in a limiting manner. For example, a configuration may be provided in which the first interlayer connecting conductor and the second interlayer connecting conductor, used for connection between the signal conductor patterns, are connected to each other with the connecting conductor pattern interposed therebetween.

The Young's modulus (E0) of the protective film 1 provided on the first main surface VS1 is preferably higher than the Young's modulus (E2) of the second resin layer (E0>E2). With this configuration, the Young's modulus on the side of the first main surface VS1 is further increased, such that the deformation of the first main surface VS1 during the mounting or heat processing of the resin multilayer board can be more effectively reduced or prevented.

Figure 4:
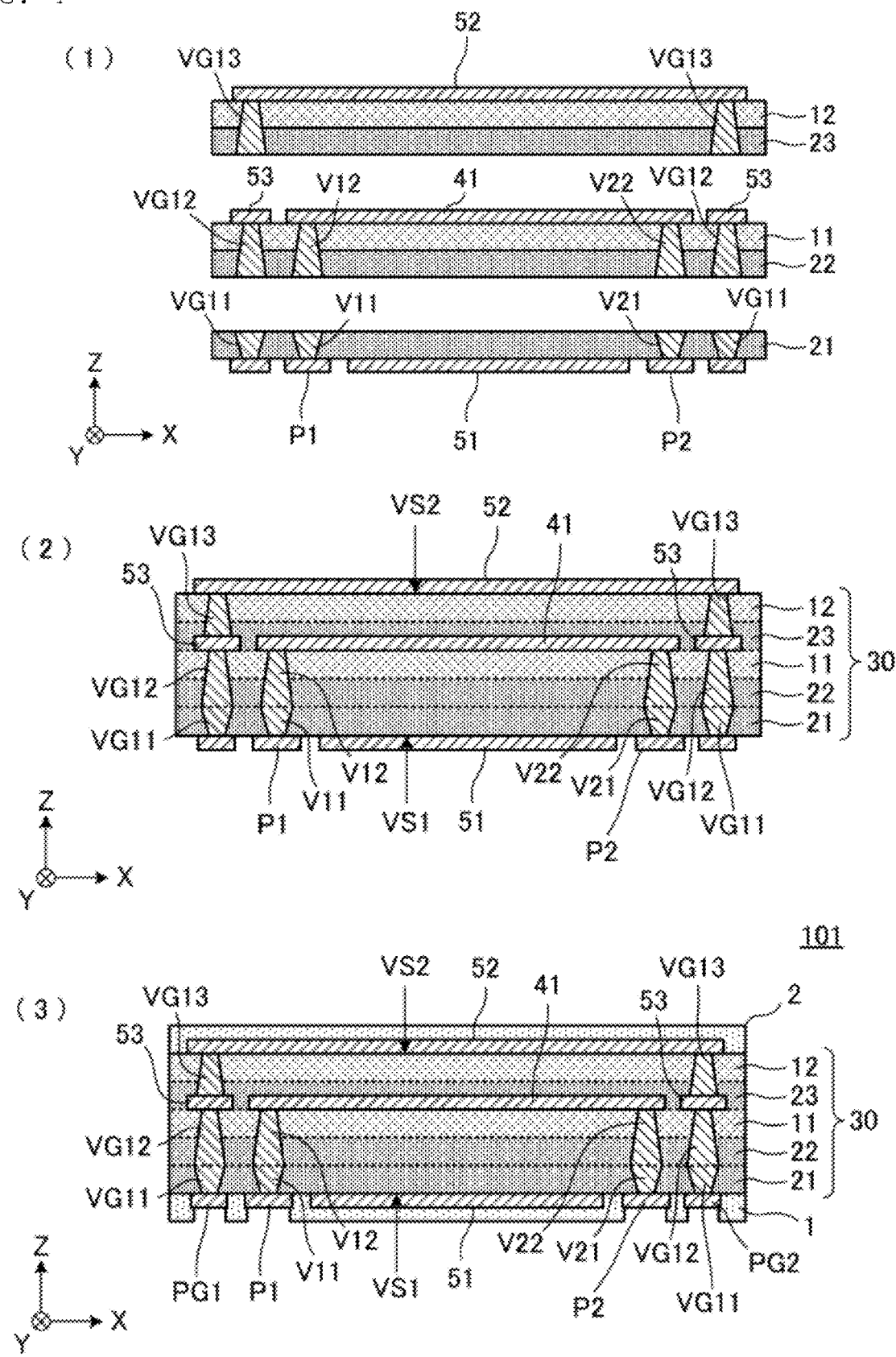
FIG. 4 is a cross-sectional view illustrating manufacturing processes of the resin multilayer board 101 in order.

The resin multilayer board 101 according to the present preferred embodiment is manufactured by, for example, the following manufacturing method. FIG. 4 is a cross-sectional view illustrating manufacturing processes of the resin multilayer board 101 in order. In FIG. 4, for convenience of description, the description is given on the manufacturing processes for one chip (individual piece). However, the actual manufacturing processes for the resin multilayer board are performed in a state of a collective board.

First of all, as illustrated in (1) in FIG. 4, the plurality of first resin layers 11 and 12 and the plurality of second resin layers 21, 22, and 23 are prepared, and a conductor pattern is formed on each of the first resin layers 11 and 12 and the second resin layers 21, 22, and 23.

Specifically, the mounting electrodes P1 and P2 and the ground conductor pattern 51 are formed on the back surface of the second resin layer 21, by laminating a metal foil (Cu foil, for example) on the back surface of the second resin layer 21, and patterning the metal foil by photolithography, for example. The signal conductor pattern 41 is formed on the front surface of the first resin layer 11 by laminating a metal foil (Cu foil, for example) on the front surface of the first resin layer 11, attaching the second resin layer 22 on the back surface of the first resin layer 11, and then performing pattering by photolithography, for example. The ground conductor pattern 52 is formed on the front surface of the first resin layer 12 by laminating a metal foil (Cu foil, for example) on the front surface of the first resin layer 12, attaching the second resin layer 23 on the back surface of the first resin layer 12, and then performing pattering by photolithography, for example.

The second resin layers 21, 22, and 23 have a higher Young's modulus and higher shape maintainability than the first resin layers 11 and 12. The first resin layers 11 and 12 are sheets preferably including, as a main component, a fluororesin such as perfluoroalkoxy alkane (PFA) and polytetrafluoroethylene (PTFE), for example. The second resin layers 21, 22, and 23 are resin sheets preferably including, for example, a liquid crystal polymer (LCP) as a main component.

The interlayer connecting conductors V11, V21, and VG11 are formed on the second resin layer 21. The interlayer connecting conductors V12, V22, and VG12 are formed on a sheet obtained by attaching the first resin layer 11 and the second resin layer 22 with each other. An interlayer connecting conductor VG13 is formed on the sheet in which the first resin layer 12 and the second resin layer 23 are joined together. Specifically, the interlayer connecting conductors V11, V21, and VG11 are provided by forming through holes in the second resin layer 21 using a laser or the like, for example, then providing a conductive paste preferably including, for example, one or more of Cu, Sn, and the like or an alloy thereof, and performing curing in later heat pressing. The interlayer connecting conductors V12, V22, and VG12 are provided by forming through holes in the first resin layer 11 and the second resin layer 22 using a laser or the like, for example, then providing a conductive paste preferably including, for example, one or more of Cu, Sn, and the like or an alloy thereof, and performing curing in later heat pressing. The interlayer connecting conductor VG13 is provided by forming through holes in the first resin layer 12 and the second resin layer 23 using a laser or the like, for example, then providing a conductive paste preferably including, for example, one or more of Cu, Sn, and the like or an alloy thereof, and performing curing in later heat pressing.

Next, the second resin layers 21 and 22, the first resin layer 11, the second resin layer 23, and the first resin layer 12 are laminated (placed) in this order. Then, the first resin layers 11 and 12 and the second resin layers 21, 22, and 23 are heat pressed (collectively pressed) in the lamination direction (Z-axis direction), such that the insulating substrate 30 illustrated in (2) in FIG. 4 is formed.

Then, as illustrated in (3) in FIG. 4, the protective film 1 is formed on the first main surface VS1 of the insulating substrate 30, and the protective film 2 is formed on the second main surface VS2 of the insulating substrate 30.

The protective films 1 and 2 are preferably, for example, a cover lay film, a solder resist film, an epoxy resin film, or the like.

Finally, the collective board is segmented into individual pieces, such that the resin multilayer board 101 is obtained.

With this manufacturing method, the first resin layers 11 and 12 and the second resin layers 21, 22, and 23 are collectively pressed, such that the insulating substrate 30 can be easily formed.

Thus, the manufacturing processes for the resin multilayer board 101 can be reduced, and the cost can be reduced.

Note that, the first resin layers 11 and 12 using a material with a low Young's modulus are likely to deform, and thus the shape thereof is difficult to maintain. Therefore, it may be difficult to laminate the first resin layers 11 and 12 only. In view of this, with the present manufacturing method, the first resin layers are laminated after the second resin layers having a relatively high Young's modulus are attached to the first resin layers, such that the maintenance of the shape and the lamination are facilitated.

Second Preferred Embodiment

In a second preferred embodiment of the present invention, an example in which a resin multilayer board is connected to a circuit board having a surface with different heights will be described.

Figure 5:
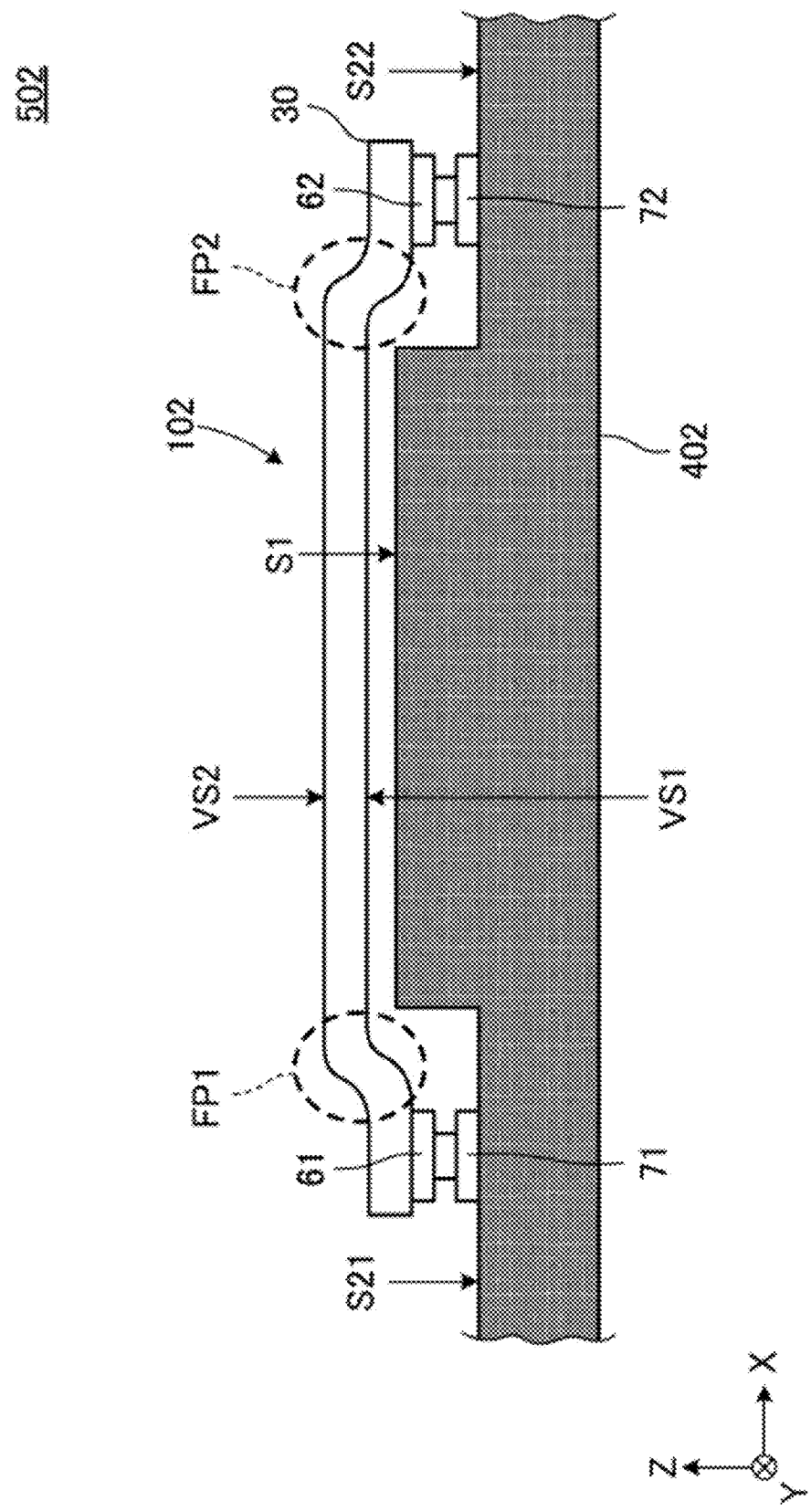
FIG. 5 is a sectional view illustrating a main portion of an electronic device 502 according to a second preferred embodiment of the present invention.

FIG. 5 is a sectional view illustrating a main portion of an electronic device 502 according to the second preferred embodiment.

The electronic device 502 includes a resin multilayer board 102, a circuit board 402, and the like. As will be described in detail later, the resin multilayer board 102 according to the present preferred embodiment is a transmission line board mounted on another circuit board.

The resin multilayer board 102 is different from the resin multilayer board 101 according to the first preferred embodiment in that it is bent (having bent portions FP1 and FP2). The resin multilayer board 102 is further different from the resin multilayer board 101 in that connectors 61 and 62 are provided. Other configurations of the resin multilayer board 102 are the same or substantially the same as those of the resin multilayer board 101.

Furthermore, the circuit board 402 is different from the circuit board 401 according to the first preferred embodiment in that the first surface S1 and second surfaces S21 and S22 having different heights in the Z-axis direction are provided. The circuit board 402 is different from the circuit board 401 in that receptacles 71 and 72 are provided. Other configurations of the circuit board 402 are the same or substantially the same as those of the circuit board 401.

Hereinafter, portions different from the electronic device 501 according to the first preferred embodiment will be described.

As illustrated in FIG. 5, the insulating substrate 30 has an elongated shape elongated in the transmission direction (X-axis direction). The connectors 61 and 62 are mounted on the first main surface VS1. Although not illustrated, the connectors 61 and 62 are connected to a mounting electrode and a ground electrode of the resin multilayer board 102 with a conductive bonding material interposed therebetween.

As illustrated in FIG. 5, the resin multilayer board 102 is mounted on the circuit board 402 while being in a bent state. Specifically, the connector 61 of the resin multilayer board 102 is connected to the receptacle 71 mounted on the second surface S21 of the circuit board 402. The connector 62 of the resin multilayer board 102 is connected to the receptacle 72 mounted on the second surface S22 of the circuit board 402.

The resin multilayer board 102 mounted while being in a bent state can be easily mounted on the circuit board having surfaces (the first surface S1 and the second surfaces S21 and S22) with different heights in the Z-axis direction. The insulating substrate 30 includes the first resin layer having a lower Young's modulus than the second resin layer, and thus can be easily bent as a whole, compared with the insulating substrate formed by laminating the plurality of second resin layers only.

When the resin multilayer board is bent as in the present preferred embodiment (when it has a bent portion), delamination is particularly likely to occur due to the stress produced in the insulating substrate. On the other hand, with the configuration according to the present preferred embodiment, the stress produced in the insulating substrate 30 can be distributed over a plurality of bonded surfaces between the first resin layers and the second resin layers, so that delamination of the insulating substrate can be reduced or prevented. Thus, for the sake of reducing or preventing the delamination of the insulating substrate, the portions of the insulating substrate 30 where the bent portions FP1 and FP2 are positioned are preferably portions where the plurality of first resin layers and the plurality of second resin layers are distributed in the lamination direction as in the present preferred embodiment.

When the insulating substrate 30 is a thermoplastic resin base body as in the present preferred embodiment, it can be plastically deformed into a desired shape (or a shape close to the desired shape) in a heated state, and the plastically deformed resin multilayer board can be mounted on a circuit board or the like. This facilitates mounting, attachment, or the like of the resin multilayer board to the circuit board or the like. When the insulating substrate 30 is plastically deformed, stress produced as a result of the connection of the connector to a circuit board (receptacle) can be made small. Although not as large as that in a case where the connector is connected to the circuit board or the like with the insulating substrate 30 bent without being plastically deformed, the connection of the connector to the circuit board or the like with the insulating substrate 30 deformed involves production of stress. On the other hand, with the configuration of the present invention (a configuration in which the plurality of first resin layers and second resin layers are arranged in a distributed manner), delamination due to the stress produced in the insulating substrate 30 as described above can be reduced or prevented.

With the configuration according to the present preferred embodiment, the Young's modulus on the side of the first main surface VS1 (mounting surface) of the insulating substrate 30 is relatively high, such that deformation of a portion (first main surface VS1) where mounted components are mounted can be reduced or prevented when the connector (mounted component) is mounted on the insulating substrate 30. Thus, the bonding failure of the mounted component on the insulating substrate 30 can be reduced or prevented.

Third Preferred Embodiment

In a third preferred embodiment of the present invention, an example in which a resin multilayer board connects two circuit boards to each other is described.

Figure 6:
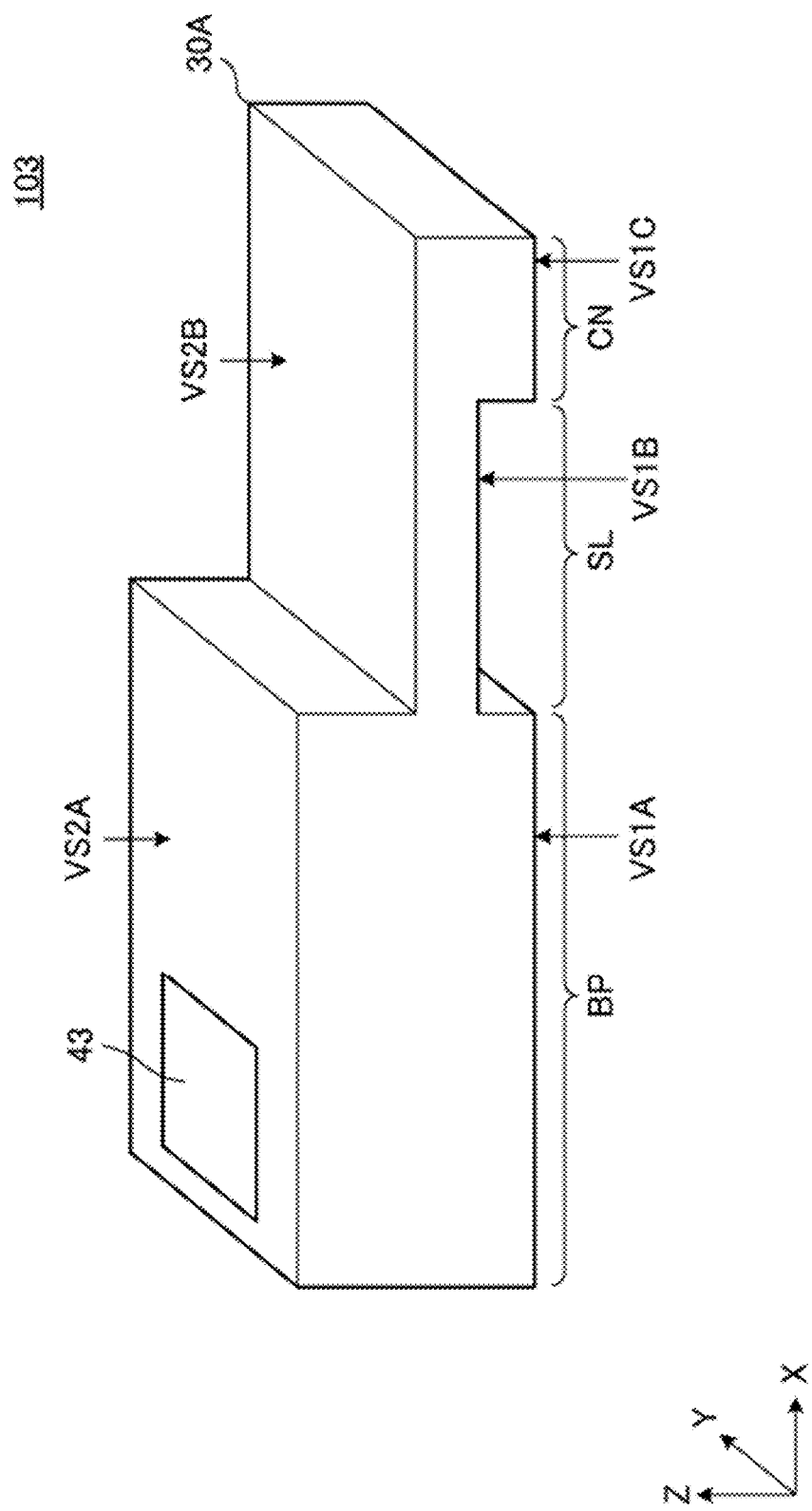
FIG. 6 is an external perspective view of a resin multilayer board 103 according to a third preferred embodiment of the present invention.

FIG. 6 is an external perspective view of a resin multilayer board 103 according to the third preferred embodiment.

Figure 7:
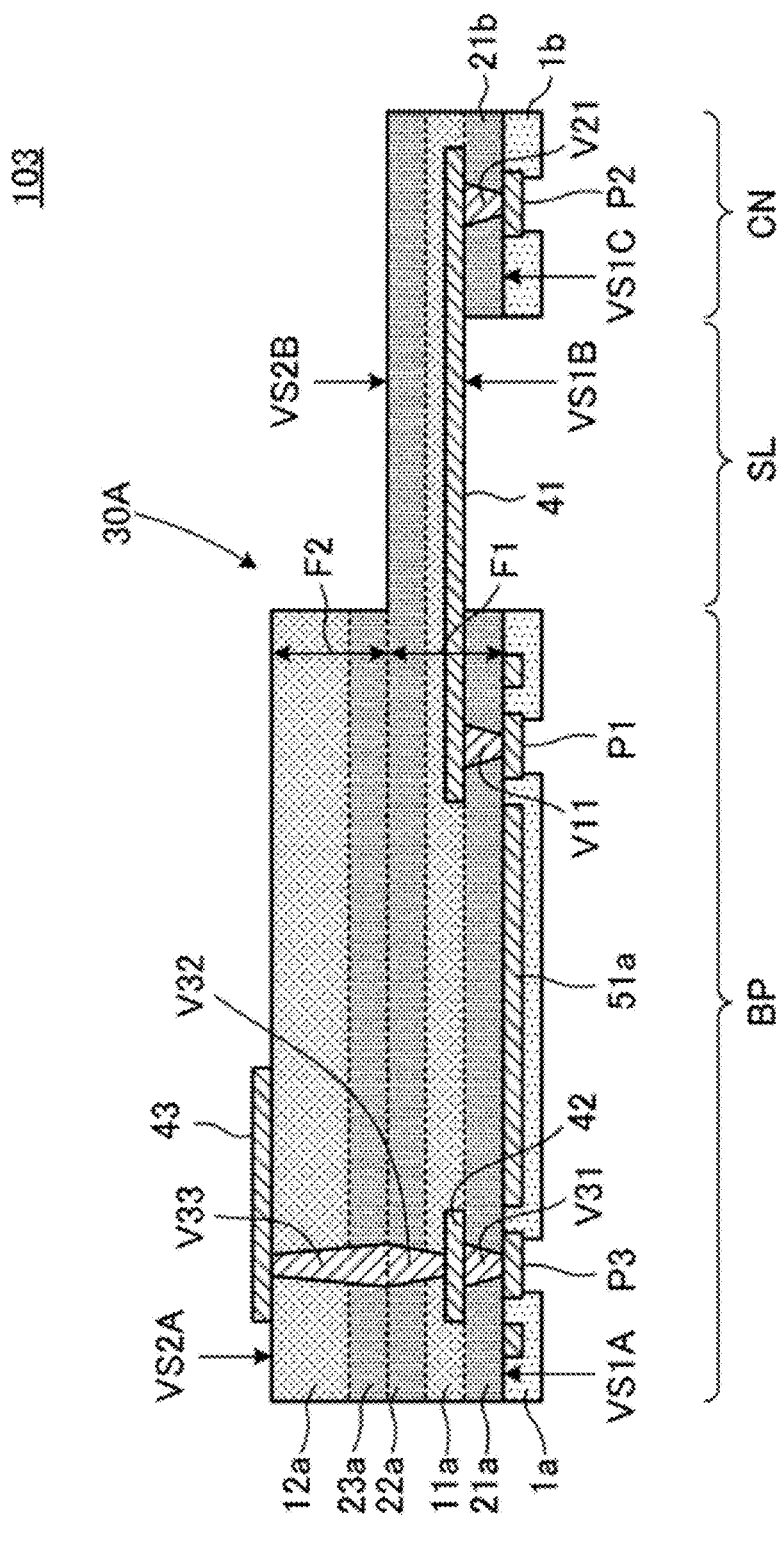
FIG. 7 is a sectional view of the resin multilayer board 103.

FIG. 7 is a sectional view of the resin multilayer board 103.

The resin multilayer board 103 includes an insulating substrate 30A, a signal conductor pattern 41, conductor patterns 42 and 43, a ground conductor pattern 51a, mounting electrodes P1, P2, and P3, interlayer connecting conductors V11, V21, V31, V32, and V33, protective films 1a and 1b, and the like.

Hereinafter, portions different from the resin multilayer board 101 according to the first preferred embodiment will be described.

The resin multilayer board 103 includes a main body portion BP, a connection portion CN, and a line portion SL. The main body portion BP and the connection portion CN are portions connected to another circuit board. The line portion SL includes a transmission line that connects the main body portion BP and the connection portion CN to each other.

The number of laminated resin layers in the line portion SL (two) is smaller than the number of laminated resin layers (five) in the main body portion BP or the number of laminated resin layers (three) in the connection portion CN. Thus, the line portion SL has higher elasticity and is more easily bent than the main body portion BP or the connection portion CN. On the other hand, the main body portion BP and the connection portion CN are harder and, thus, are more difficult to be bent than the line portion SL.

The insulating substrate 30A is a rectangular or substantially rectangular flat plate having a longitudinal direction matching the X-axis direction.

The insulating substrate 30A is a base body preferably including a thermoplastic resin as a main component.

The insulating substrate 30A includes a first main surface VS1A and a second main surface VS2A opposite to each other. The first main surface VS1A and the second main surface VS2A are surfaces located on the main body portion BP. The insulating substrate 30A includes first main surfaces VS1B and VS1C and a second main surface VS2B opposite to each other. The first main surfaces VS1B and VS1C and the second main surface VS2B are surfaces located on the line portion SL and the connection portion CN.

The mounting electrodes P1 and P3, the ground conductor pattern 51a, and the protective film 1a are provided on the first main surface VS1A of the insulating substrate 30A. The mounting electrode P2 and the protective film 1b are provided on the first main surface VS1C of the insulating substrate 30A.

The signal conductor pattern 41, the conductor pattern 42, and the interlayer connecting conductors V11, V21, V31, V32, and V33 are provided in the insulating substrate 30A. A radiating conductor pattern 43 is provided on the second main surface VS2A of the insulating substrate 30A. The radiating conductor pattern 43 is also an example of the "conductor pattern".

The insulating substrate 30A is a laminated body including a plurality of first resin layers 11a and 12a and a plurality of second resin layers 21a, 21b, 22a, and 23a that are laminated. The basic configuration of the first resin layers 11a and 12a is the same or substantially the same as that of the first resin layers 11 and 12 described in the first preferred embodiment. The basic configuration of the second resin layers 21a, 22a, and 23a is the same or substantially the same as that of the second resin layers 21, 22, and 23 described in the first preferred embodiment.

In the main body portion BP, the plurality of first resin layers 11a and 12a and the plurality of second resin layers 21a, 22a, and 23a are arranged in a distributed manner in the lamination direction (Z-axis direction). Specifically, the insulating substrate 30A in the main body portion BP includes the second resin layer 21a, the first resin layer 11a, the second resin layers 22a and 23a, and the first resin layer 12a that are laminated in this order. The insulating substrate 30A in the line portion SL includes the first resin layer 11a and the second resin layer 22a that are laminated in this order.

The insulating substrate 30A in the connection portion CN includes the second resin layer 21b, the first resin layer 11a, and the second resin layer 22a that are laminated in this order.

The mounting electrodes P1 and P3 and the ground conductor pattern 51a are provided on the back surface of the second resin layer 21a. The mounting electrode P3 is a rectangular or substantially rectangular conductor pattern arranged near a first end of the second resin layer 21a (the left end of the second resin layer 21a in FIG. 7). The mounting electrode P1 is a rectangular or substantially rectangular conductor pattern arranged near a second end of the second resin layer 21a (the right end of the second resin layer 21a in FIG. 7). The ground conductor pattern 51a is a planar conductor pattern provided on the entire or substantially the entire surface of the second resin layer 21a. The basic configuration of the ground conductor pattern 51a is the same or substantially the same as that of the ground conductor pattern 51 described in the first preferred embodiment. The mounting electrode P3 is a conductor pattern, such as Cu foil, for example.

The mounting electrode P2 is provided on the back surface of the second resin layer 21b. The mounting electrode P2 is a rectangular or substantially rectangular conductor pattern arranged substantially in the center of the second resin layer 21b.

The signal conductor pattern 41 and the conductor pattern 42 are provided on the back surface of the first resin layer 11a. The signal conductor pattern 41 is a linear conductor pattern extending in the transmission direction (X-axis direction), and is positioned closer to the second end (right end of the first resin layer 11a in FIG. 7) than to the center of the first resin layer 11a. The conductor pattern 42 is a rectangular or substantially rectangular conductor pattern arranged near a first end of the first resin layer 11a (the left end of the first resin layer 11a in FIG. 7). The conductor pattern 42 is a conductor pattern, such as Cu foil, for example.

The radiating conductor pattern 43 is provided on the front surface of the first resin layer 12a.

The radiating conductor pattern 43 is a rectangular or substantially rectangular conductor pattern arranged near a first end of the first resin layer 12a (the left end of the first resin layer 12a in FIG. 7). The radiating conductor pattern 43 is a conductor pattern, such as Cu foil for example.

The protective film 1a is laminated on the back surface of the second resin layer 21a (the first main surface VS1A of the insulating substrate 30A), and has the same or substantially the same planar shape as the second resin layer 21a. The protective film 1a includes openings at positions corresponding to the positions of the mounting electrodes P1 and P3. Thus, even when the protective film 1a is provided on the back surface of the second resin layer 21a, the mounting electrodes P1 and P3 are exposed to the outside through the openings. The protective film 1a is preferably, for example, a cover lay film, a solder resist film, an epoxy resin film, or the like.

The protective film 1b is laminated on the back surface of the second resin layer 21b (the first main surface VS1C of the insulating substrate 30A), and has the same or substantially the same planar shape as the second resin layer 21b. The protective film 1b includes an opening at a position corresponding to the mounting electrode P2. Thus, even when the protective film 1b is provided on the back surface of the second resin layer 21b, the mounting electrode P2 is exposed to the outside through the opening. The protective film 1b is preferably, for example, a cover lay film, a solder resist film, an epoxy resin film, or the like.

As illustrated in FIG. 7, the mounting electrode P1 is connected to one end of the signal conductor pattern 41 with the interlayer connecting conductor V11 interposed therebetween. The other end of the signal conductor pattern 41 is connected to the mounting electrode P2 with the interlayer connecting conductor V21 interposed therebetween. Thus, the mounting electrodes P1 and P2 are electrically connected to each other. The mounting electrode P3 is connected to the radiating conductor pattern 43 with the conductor pattern 42 and the interlayer connecting conductors V31, V32, and V33 interposed therebetween. In the present preferred embodiment, the radiating conductor pattern 43 is a radiating element of the antenna.

The insulating substrate 30A of the main body portion BP includes the first portion F1 and the second portion F2. The volume ratio of the second resin layer in the first portion F1 is higher than the volume ratio of the second resin layer in the second portion F2. In the present preferred embodiment, the radiating conductor pattern 43 is in contact with the first resin layer 12.

Figure 8:
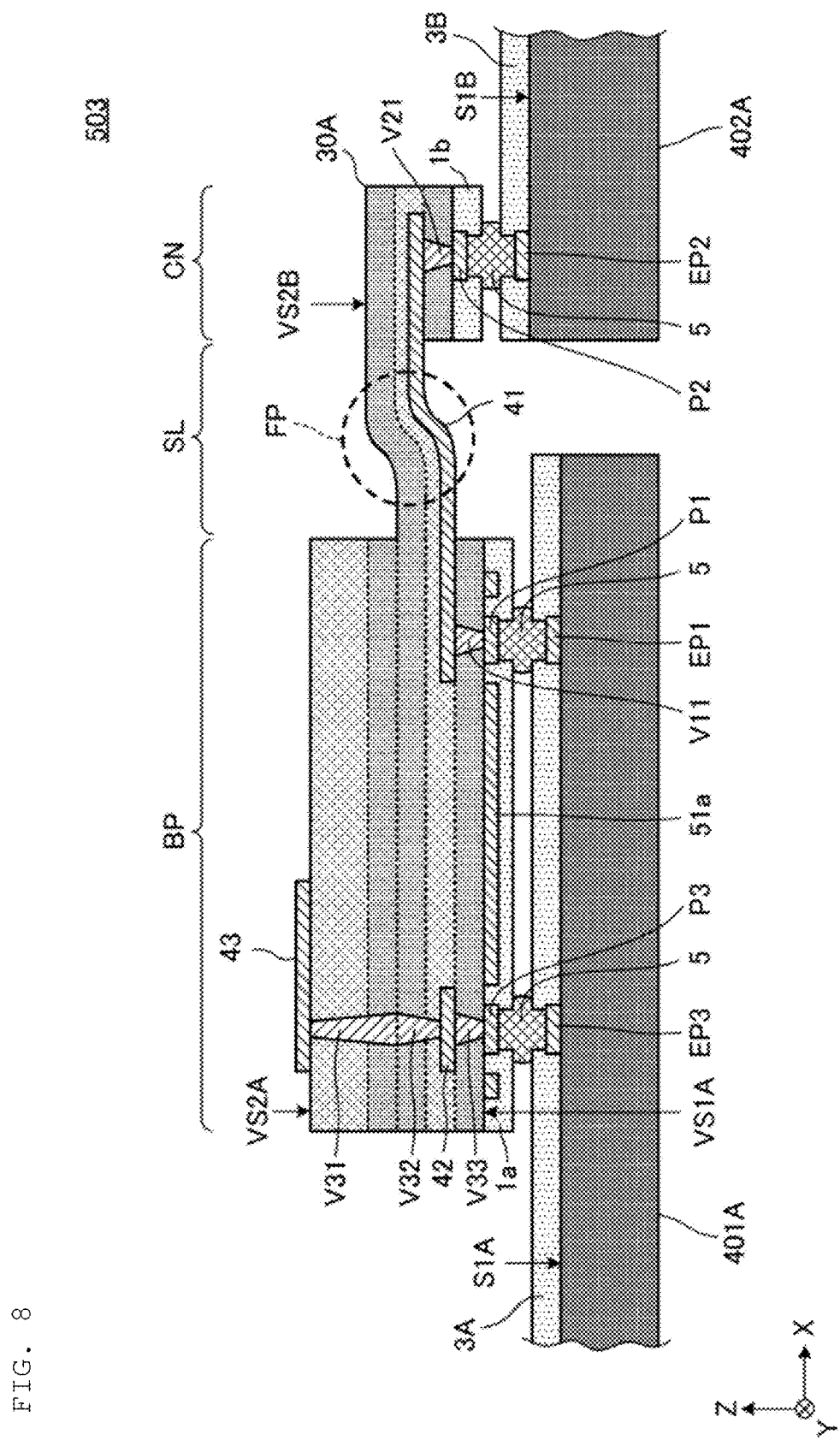
FIG. 8 is a sectional view illustrating a main portion of an electronic device 503 according to the third preferred embodiment of the present invention.

Next, a mounting example of the resin multilayer board 103 will be described with reference to FIG. 8. FIG. 8 is a sectional view illustrating a main portion of an electronic device 503 according to the third preferred embodiment.

The resin multilayer board according to the present preferred embodiment is a substrate that connects two circuit boards to each other.

The electronic device 503 includes the resin multilayer board 103, circuit boards 401A and 402A, and the like. In the electronic device 503, the resin multilayer board 103 includes a bent portion FP. External electrodes EP1 and EP3 and a protective film 3A are provided on a first surface S1A of the circuit board 401A. Further, the external electrode EP2 and a protective film 3B are provided on a first surface S1B of the circuit board 402A. The circuit boards 401A and 402A are preferably, for example, glass/epoxy boards.

The resin multilayer board 103 is mounted on the circuit boards 401A and 402A in a state where the line portion SL is bent. Although not illustrated, other chip components and the like are also mounted on the first surface S1A of the circuit board 401A and the first surface S1B of the circuit board 402A.

As illustrated in FIG. 8, the main body portion BP is mounted on the first surface S1A of the circuit board 401A, and the connection portion CN is mounted on the first surface S1B of the circuit board 402A. Specifically, the mounting electrode P1 of the resin multilayer board 103 is connected to the external electrode EP1 of the circuit board 401A with the conductive bonding material 5 interposed therebetween. The mounting electrode P3 of the resin multilayer board 103 is connected to the external electrode EP3 of the circuit board 401A with the conductive bonding material 5 interposed therebetween.

In the present preferred embodiment, the radiating conductor pattern 43 is provided on the second main surface VS2A of the main body portion BP. With this configuration, as compared with the case where the radiating conductor pattern 43 is provided inside the insulating substrate 30A, unwanted coupling between the radiating conductor pattern and the other conductors (other conductor patterns provided on the insulating substrate 30A and conductors formed on the circuit board 401A) can be reduced or prevented.

In the present preferred embodiment, the radiating conductor pattern 43 is in contact with the first resin layer 12a With this configuration, the radiating conductor pattern is arranged near the first resin layer 12a with a higher high frequency characteristics than the second resin layers 21a, 22a, and 23a, such that radiation efficiency of an antenna at high frequencies is improved.

In the present preferred embodiment, an example of the resin multilayer board including the radiating conductor pattern provided on the second main surface of the insulating substrate (main body portion) is described, but this configuration should not be construed in a limiting manner. The radiating conductor pattern is preferably one of the conductor patterns provided on the insulating substrate that is arranged closest to the second main surface of the insulating substrate. Still, the radiating conductor pattern is preferably provided on the second main surface of the insulating substrate to reduce or prevent unwanted coupling with other conductors or the like. When the volume ratio of the first resin layer having excellent high frequency characteristics is high in the second portion F2 (the side of the second main surface VS2A of the main body portion BP) as in the present preferred embodiment, the radiating conductor pattern is preferably arranged in the second portion F2.

In the present preferred embodiment, the connection portion CN is less bendable than the line portion SL. Thus, the shape maintainability of the connection portion CN is high even when the line portion SL is bent. Thus, the connection portion CN features high mountability to the circuit board 402A.

In the resin multilayer board 103 of the present preferred embodiment, the portion (line portion SL) where the bent portion FP is located is a laminated body including the first resin layer (11a) and the second resin layer (22a). With this configuration, the flexibility of the line portion SL where the bent portion FP is located can be adjusted based on the volume ratios of the first resin layer and the second resin layer. Thus, the bent portion having a predetermined thickness and a predetermined flexibility can be provided only based on the volume ratios of the first resin layer and the second resin layer, without using other members, such as a protective film.

In the present preferred embodiment, an example is described where the bent portion FP (line portion SL) is a laminated body including one first resin layer (11a) and one second resin layer (22a), but this configuration should not be construed in a limiting sense. The bent portion FP may be a laminated body including a plurality of first resin layers and one second resin layer, or a laminated body including one first resin layer and a plurality of second resin layers.

The bent portion FP may have the shape maintained (retained) with the line portion SL plastically deformed. In the present preferred embodiment, the insulating substrate 30A is a base body made of the thermoplastic resin, and thus can be easily plastically deformed. Thus, the resin multilayer board can be easily picked up and handled, with respect to a circuit board.

In each of the above-described preferred embodiments, an example in which the insulating substrate is a rectangular or substantially rectangular flat plate is described, but this configuration should not be construed in a limiting manner. The shape of the insulating substrate can be appropriately changed as long as one or more of the advantageous operations and effects of preferred embodiments of the present invention can be obtained. For example, the insulating substrate may have a L shape, a crank shape, a T shape, a Y shape, or the like in plan view.

The bent shape of the resin multilayer board is not limited to the configuration in each of the preferred embodiments described above, and the shape may be changed as appropriate as long as one or more of the advantageous operations and effects of preferred embodiments of the present invention can be obtained.

Further, in each of the above-described preferred embodiments, the insulating substrates 30 and 30A including two first resin layers and three second resin layers that are laminated are described, but the insulating substrate of the present invention is not limited to this configuration. The number of first resin layers and the number of second resin layers of the insulating substrate can be changed as appropriate as long as one or more of the advantageous operations and effects of preferred embodiments of the present invention can be obtained. The insulating substrate of the present invention does not necessarily need to include the protective film on the first main surface and the second main surface.

In each of the above-described preferred embodiments, examples are illustrated in which the insulating substrates 30 and 30A are flat plates made of a thermoplastic resin, but this configuration should not be construed in a limiting manner.

The insulating substrate may be a flat plate including a thermosetting resin, for example.

The melting point (Tm2) of the second resin layer is preferably higher than the melting point (Tm1) of the first resin layer (Tm1<Tm2). In the insulating substrate of preferred embodiments of the present invention, the volume ratio of the second resin layer in the first portion F1 positioned on the side of the first main surface is larger than the volume ratio of the second resin layer in the second portion F2. Thus, with this configuration, the deformation of the first main surface as a result of the application of heat (such as a reflow process, a heat pressing, or bending process using heating) to the resin multilayer board can be reduced or prevented, such that a risk of the mounting failure can be reduced.

A circuit configuration provided on the resin multilayer board is not limited to the configuration in each of the preferred embodiments described above, and the shape may be changed as appropriate as long as one or more of the advantageous operations and effects of preferred embodiments of the present invention can be obtained. For example, as a circuit provided on the resin multilayer board, a coil defined by a conductor pattern, a capacitor defined by a conductor pattern, or a frequency filter, such as various filters (a low-pass filter, a high-pass filter, band-pass filter, or band elimination filter) may be provided.

Further, for example, various other transmission lines (such as a microstrip line, meander, or coplanar) may be provided on the resin multilayer board. Various electronic components, such as chip components, for example, may be mounted on or embedded in the resin multilayer board.

In each of the above-described preferred embodiments, an example of a resin multilayer board in which one transmission line is provided is described. However, this configuration should not be construed in a limiting manner, and the number of transmission lines may be changed as appropriate depending on a circuit configuration provided on the resin multilayer board.

In each of the above-described preferred embodiments, an example in which the rectangular or substantially rectangular mounting electrodes P1, P2, and P3 are provided on the first main surface VS1 of the insulating substrate is described. However, this configuration should not be construed in a limiting manner. The shape and the number of the mounting electrodes can be appropriately changed as long as one or more of the advantageous operations and effects of preferred embodiments of the present invention can be obtained. For example, the mounting electrode may have a polygonal shape, circular shape, elliptical shape, arcuate shape, ring shape, L shape, U shape, T shape, Y shape, crank shape, or the like in plan view.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer board comprising:
    an insulating substrate including a plurality of first resin layers and a plurality of second resin layers that are laminated, the insulating substrate including a first main surface;
    conductor patterns provided on the insulating substrate; and
    a mounting electrode provided only on the first main surface; wherein
    a Young's modulus of the plurality of second resin layers is higher than a Young's modulus of the plurality of first resin layers;
    the plurality of first resin layers and the plurality of second resin layers are arranged in a distributed manner along a lamination direction of the plurality of first resin layers and the plurality of second resin layers;
    the insulating substrate includes a first portion and a second portion that are two equally divided portions of the insulating substrate in the lamination direction and are respectively positioned closer to the first main surface and farther from the first main surface; and
    a volume ratio of the plurality of second resin layers in the first portion is higher than a volume ratio of the plurality of second resin layers in the second portion.

2. The resin multilayer board according to claim 1, further comprising:
    a protective film provided on the first main surface; wherein
    a Young's modulus of the protective film is higher than the Young's modulus of the first resin layers.

3. The resin multilayer board according to claim 1, wherein a relative permittivity of the plurality of first resin layers is lower than a relative permittivity of the second resin layers.

4. The resin multilayer board according to claim 3, wherein
    the insulating substrate includes a second main surface opposite to the first main surface;
    one of the conductor patterns arranged closest to the second main surface is a radiating conductor pattern; and
    the radiating conductor pattern closest to the second main surface is in contact with any one of the plurality of first resin layers.

5. The resin multilayer board according to claim 1, further comprising:
    a first interlayer connecting conductor provided on any one of the plurality of first resin layers; and
    a second interlayer connecting conductor provided on a second resin layer, of the plurality of the second resin layers, adjacent to the first resin layer; wherein
    the conductor patterns include a connecting conductor pattern that is arranged on an interface between the first resin layer and the second resin layer adjacent to each other and is sandwiched between the first interlayer connecting conductor and the second interlayer connecting conductor;
    the first interlayer connecting conductor and the second interlayer connecting conductor are connected to each other with the connecting conductor pattern interposed therebetween; and
    an area of the connecting conductor pattern is larger than an area of the first interlayer connecting conductor as viewed in the lamination direction, and is larger than an area of the second interlayer connecting conductor as viewed in the lamination direction.

6. The resin multilayer board according to claim 1, further comprising a bent portion.

7. The resin multilayer board according to claim 6, wherein a portion of the insulating substrate where the bent portion is located is a portion where the plurality of first resin layers and the plurality of second resin layers are arranged in the distributed manner along the lamination direction.

8. The resin multilayer board according to claim 6, wherein the bent portion is a laminated body including at least one of the plurality of first resin layers and at least one of the plurality of second resin layers.

9. The resin multilayer board according to claim 1, wherein the insulating substrate includes a thermoplastic resin.

10. The resin multilayer board according to claim 9, wherein the plurality of second resin layers include a liquid crystal polymer as a main component.

11. The resin multilayer board according to claim 1, wherein the plurality of first resin layers include a fluororesin as a main component.

12. A resin multilayer board comprising:
an insulating substrate including a plurality of first resin layers including a fluororesin as a main component and a plurality of second resin layers including a liquid crystal polymer as a main component that are laminated, the insulating substrate including a first main surface;
conductor patterns provided on the insulating substrate; and
a mounting electrode provided only on the first main surface; wherein
the plurality of first resin layers and the plurality of second resin layers are arranged in a distributed manner along a lamination direction of the plurality of first resin layers and the plurality of second resin layers;
the insulating substrate includes a first portion and a second portion that are two equally divided portions of the insulating substrate in the lamination direction and are respectively positioned closer to the first main surface and farther from the first main surface; and
a volume ratio of the plurality of second resin layers in the first portion is higher than a volume ratio of the plurality of second resin layers in the second portion.

13. The resin multilayer board according to claim 12, wherein the plurality of first resin layers include perfluoroalcoxyalcan as a main component.

14. The resin multilayer board according to claim 12, wherein the plurality of first resin layers include polytetrafluoroethylene as a main component.

15. The resin multilayer board according to claim 12, further comprising:
a protective film provided on the first main surface; wherein
a Young's modulus of the protective film is higher than the Young's modulus of the first resin layers.

16. The resin multilayer board according to claim 12, wherein a relative permittivity of the plurality of first resin layers is lower than a relative permittivity of the second resin layers.

17. The resin multilayer board according to claim 16, wherein
the insulating substrate includes a second main surface opposite to the first main surface;
one of the conductor patterns closest to the second main surface is a radiating conductor pattern; and
the radiating conductor pattern closest to the second main surface is in contact with any one of the plurality of first resin layers.

18. The resin multilayer board according to claim 12, further comprising:
a first interlayer connecting conductor provided on any one of the plurality of first resin layers; and
a second interlayer connecting conductor provided on a second resin layer, of the plurality of the second resin layers, adjacent to the first resin layer; wherein
the conductor patterns include a connecting conductor pattern that is arranged on an interface between the first resin layer and the second resin layer adjacent to each other and is sandwiched between the first interlayer connecting conductor and the second interlayer connecting conductor;
the first interlayer connecting conductor and the second interlayer connecting conductor are connected to each other with the connecting conductor pattern interposed therebetween; and
an area of the connecting conductor pattern is larger than an area of the first interlayer connecting conductor as viewed in the lamination direction, and is larger than an area of the second interlayer connecting conductor as viewed in the lamination direction.

19. The resin multilayer board according to claim 12, further comprising a bent portion.

20. The resin multilayer board according to claim 19, wherein a portion of the insulating substrate where the bent portion is located is a portion where the plurality of first resin layers and the plurality of second resin layers are arranged in the distributed manner along the lamination direction.

* * * * *